United States Patent
Chen et al.

(10) Patent No.: US 6,191,001 B1
(45) Date of Patent: Feb. 20, 2001

(54) SHALLOW TRENCH ISOLATION METHOD

(75) Inventors: Alan Sangone Chen, Windermere; Seungmoo Choi, Orlando; Donald Thomas Cwynar, Orlando; Timothy Edward Doyle, Orlando; Troy A. Giniecki, Kissimmee, all of FL (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/383,050

(22) Filed: Aug. 25, 1999

(51) Int. Cl.⁷ .................................................. H01L 21/76
(52) U.S. Cl. ............................................. 438/427; 438/424
(58) Field of Search ................................... 438/299, 404, 438/424, 425, 426, 427, 435, 436, 437, 694, 697, 692, 700, 702, 703

(56) References Cited

U.S. PATENT DOCUMENTS

| | | |
|---|---|---|
| 4,835,115 | 5/1989 | Eklund . |
| 5,663,588 | 9/1997 | Suzuki et al. . |
| 5,712,185 | 1/1998 | Tsai et al. . |
| 5,851,899 * | 12/1998 | Weigand ............................. 438/427 |
| 5,880,004 | 3/1999 | Ho . |
| 5,882,982 | 3/1999 | Zheng et al. . |
| 5,895,253 | 4/1999 | Akram . |
| 5,895,254 | 4/1999 | Huang et al. . |
| 5,902,752 | 5/1999 | Sun et al. . |
| 5,904,540 | 5/1999 | Sheng et al. . |
| 5,911,110 | 6/1999 | Yu . |
| 6,004,863 * | 12/1999 | Jang ..................................... 438/427 |
| 6,037,236 * | 3/2000 | Jang ..................................... 438/401 |

* cited by examiner

Primary Examiner—David Nelms
Assistant Examiner—David Vu

(57) ABSTRACT

A method of manufacturing a semiconductor device using shallow trench isolation is provided, wherein a plurality of protrusions are formed in the exposed surface of the mask layer overlying the active area of the device. The protrusions are preferably formed by forming a photo-resist layer on the surface of the mask layer and patterning the photo-resist layer such that the photo-resist layer defines a plurality of protrusion areas and a depression area within the defined active area. A portion of the mask layer is removed in the defined depression area to form a plurality of protrusions in the mask layer. Thereafter, a dielectric layer is deposited on the exposed surface of the mask layer and in the shallow trench and evenly planarized.

25 Claims, 4 Drawing Sheets

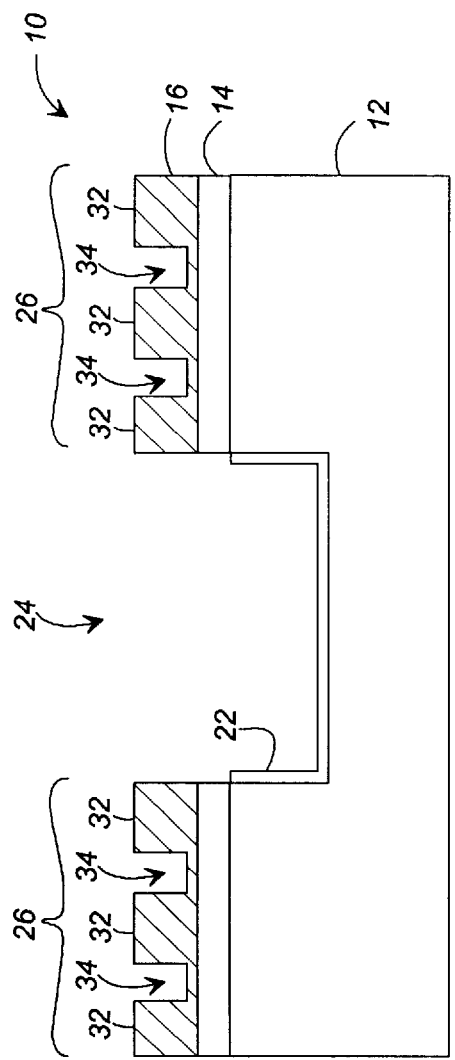
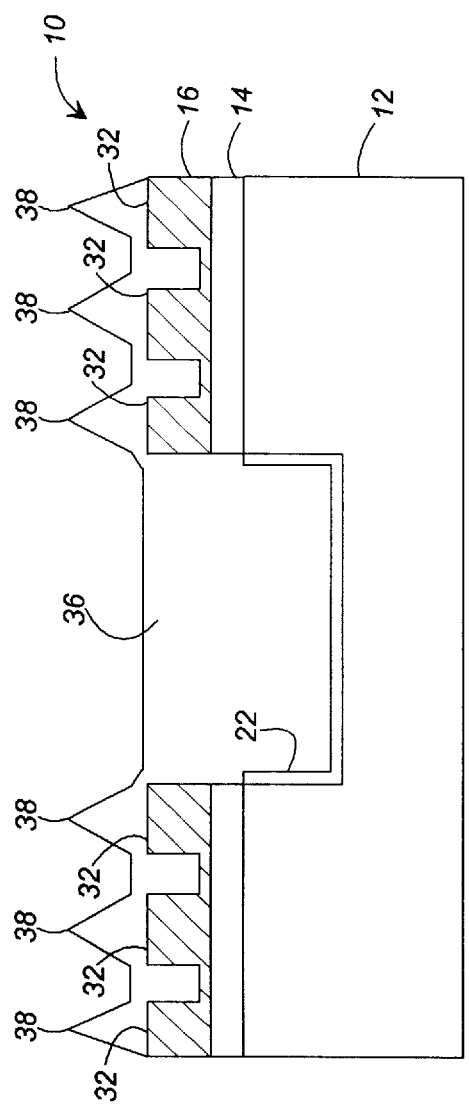

SHALLOW TRENCH ISOLATION METHOD

FIELD OF THE INVENTION

The present invention relates to a method for isolating devices built on a semiconductor substrate. More particularly, the present invention relates to a shallow trench isolation method.

BACKGROUND OF THE INVENTION

As methods of fabricating semiconductor integrated circuits (IC) continually improve, the number of devices that may be introduced into a single semiconductor chip has increased, while the size of each device has decreased. Millions of devices may now be fabricated on a single chip. Particularly in such high-density semiconductor devices, individual devices must be properly isolated in order to maintain acceptable performance. For example, improper isolation between transistors may cause additional leakage current, resulting in poor noise margin, threshold voltage shift, cross-talk and circuit latchup.

In metal-oxide semiconductor (MOS) technology, isolation is generally achieved by forming isolation regions between neighboring active areas. Typically, an isolation area is formed by ion-doping a channel stop of polarity opposite to the source electrode and the drain electrode of the IC device, and growing a thick oxide, often referred to as field oxide (FOX). The channel stop and the FOX cause the threshold voltage in the isolation area to be much higher than those in the neighboring active regions, thereby insuring that surface inversion does not occur under the FOX area.

One method known in the art for laterally isolating IC devices is known as Local Oxidation of Silicon (LOCOS). A LOCOS structure is typically formed by using a patterned silicon nitride layer together with a pad oxide to mask the active areas, followed by ion-implantation in the isolation region. Thereafter, a thick field oxide is grown locally in the isolation region. The LOCOS structure possesses some inherent drawbacks, such as lateral oxidation of the silicon underneath the silicon nitride mask, which makes the edge of the field oxide region resemble the shape of a bird's beak. The bird's beak shape causes unacceptably large encroachment of the field oxide into the device active regions.

Shallow trench isolation (STI) technology was created to overcome the disadvantages of the LOCOS technique. A basic STI procedure involves etching shallow trenches into the silicon substrate, depositing a field oxide onto the substrate, and planarizing the deposited oxide layer using chemical-mechanical polishing (CMP).

While the conventional STI process prevents the bird's beak effect and reduces cross-disturbance between adjacent electric fields, it is difficult to evenly planarize the deposited field oxide layer. As the field oxide layer is deposited, peaks and bumps in the field oxide layer are created due to the uneven topography of the semiconductor device. The peaks and bumps, which are primarily located above active areas of the device, make it difficult to evenly planarize the field oxide layer using conventional techniques, such as chemical-mechanical polishing. An unevenly planarized surface may result in inadequate isolation, resulting in poor electrical characteristics. Additionally, an unevenly planarized wafer makes subsequent processing steps, such as photolithography, difficult to perform.

One method known in the art for dealing with this problem involves creating a reverse tone structure, wherein a photo-resist layer is patterned on the exposed surface of the deposited field oxide layer to mask the trench areas. Thereafter, the peaks and bumps formed over the active areas of the device are etched such that they have a substantially planar top surface. Thus, after removal of the photo-resist layer, a relatively uniform surface is created for planarization. However, over-etching is possible, resulting in damage to the field oxide isolation region or active area.

To avoid the problem of over-etching, another solution to the planarization problem involves use of "dummy" features in the trench isolation area. Using this method, instead of creating a uniform trench across the isolation region, a plurality of dummy active areas is defined within the isolation region. The plurality of protruding dummy active areas within the trench creates multiple bumps or peaks when the field oxide layer is deposited. Although the use of dummy features within the field oxide region diminishes the difficulty of planarization, the presence of larger, "true" active areas, and corresponding wider peaks of deposited field oxide, can still cause problems during planarization. Additionally, the photomask used to define the dummy active areas within the field oxide regions is expensive to prepare due to the large number of dummy features that is typically required.

Thus, there remains a need in the art for a method of achieving even planarization during a shallow trench isolation procedure.

SUMMARY OF THE INVENTION

The present invention provides a method of manufacturing a semiconductor device using shallow trench isolation that allows even planarization of the field oxide or dielectric layer. The method of the present invention includes forming a plurality of protrusions in the exposed surface of the mask layer overlying the active areas of the device. By forming a plurality of protrusions in this area of the mask layer, the subsequent deposition of the dielectric layer creates a plurality of small peaks or bumps in the portion of the dielectric layer overlying the active areas of the device. The small peaks or bumps are easily planarized using conventional techniques, such as chemical-mechanical polishing, without the need for dummy features in the trench area of the device.

In one embodiment, the method of the present invention includes forming a pad oxide layer on a semiconductor substrate and forming a mask layer on the exposed surface of the pad oxide layer. An active area and an isolation area are defined on the substrate and a trench is formed in the defined isolation area, the trench extending through the mask layer and pad oxide layer and into the substrate. A plurality of protrusions in the exposed surface of the mask layer overlying the defined active area are formed. Thereafter, a dielectric layer is deposited on the exposed surface of the mask layer and in the trench. Planarization of the dielectric layer may then be performed.

Preferably, the plurality of protrusions described above are formed by using photolithography and etching techniques known in the art. For example, a photo-resist layer may be formed on the exposed surface of the mask layer and in the trench. The photo-resist layer is patterned such that the photo-resist layer defines a plurality of protrusion areas and a depression area within the defined active area of the device. A portion of the mask layer in the defined depression area is removed to form a plurality of protrusions in the mask layer. Thereafter, the remaining portion of the photo-resist layer may be removed.

BRIEF DESCRIPTION OF THE DRAWINGS

Figure 1:
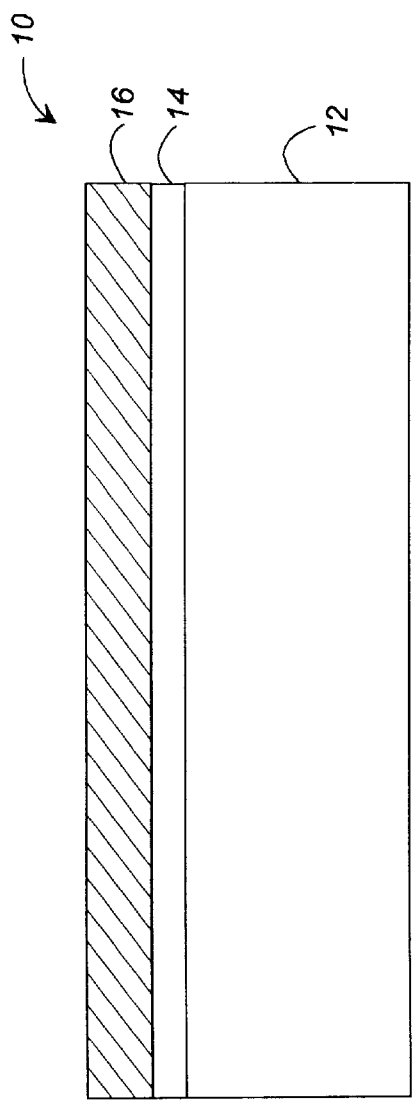
Figure 2:
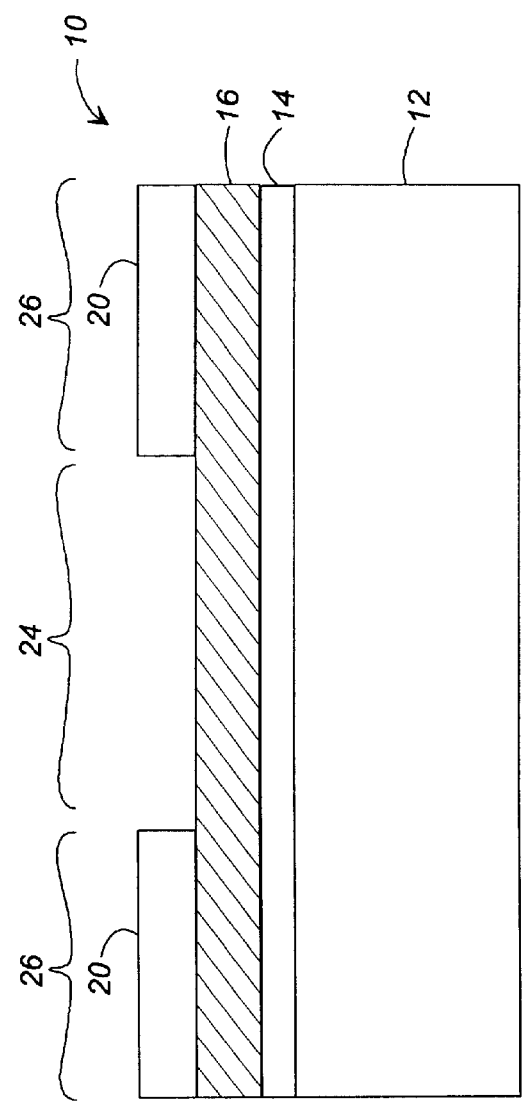
Figure 3:
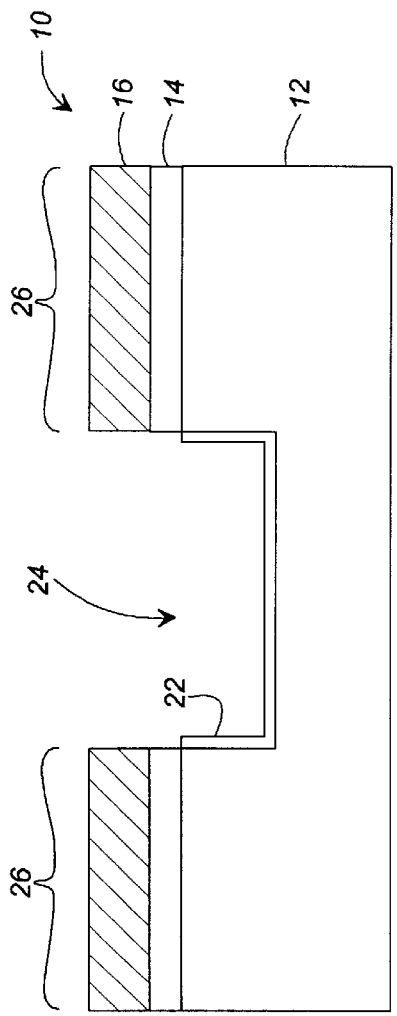
Figure 4:
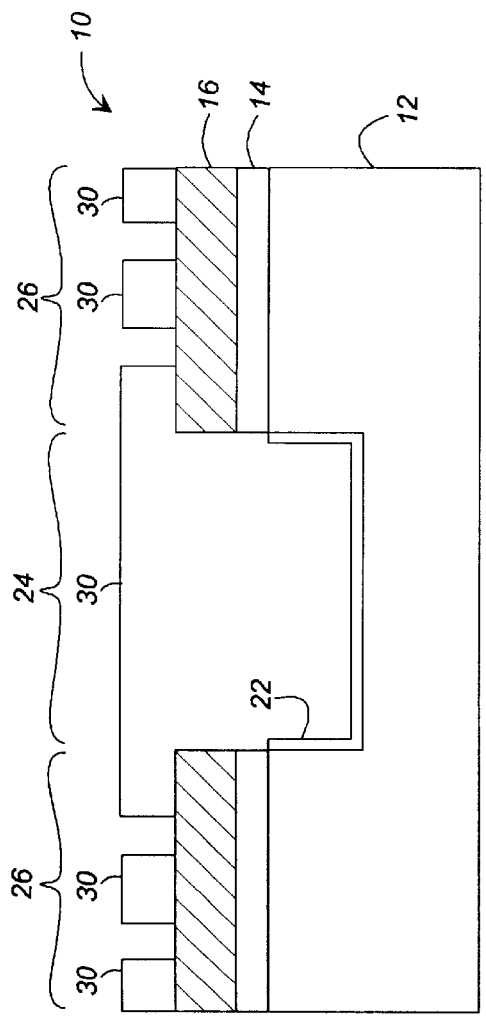
Figure 7:
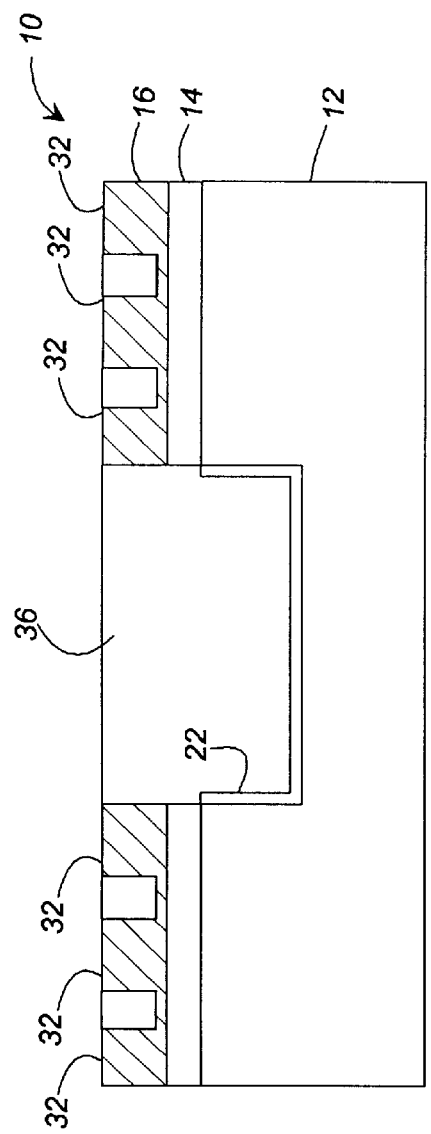
Figure 8:
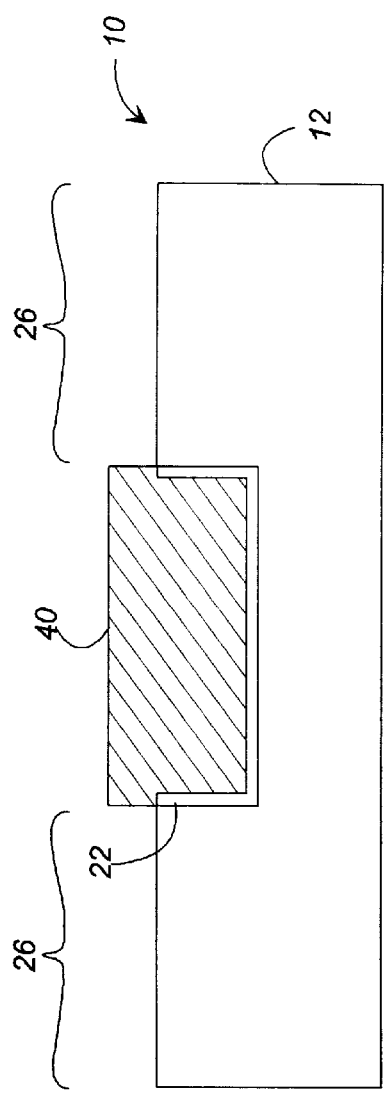

Having thus described the invention in general terms, reference will now be made to the accompanying drawings, which are not necessarily drawn to scale, and wherein:

FIG. 1 is a cross-sectional view of a semiconductor substrate having a pad oxide layer and mask layer formed thereon;

FIG. 2 is a cross-sectional view of a semiconductor substrate having a patterned photo-resist layer overlying the mask layer;

FIG. 3 is a cross-sectional view of a semiconductor substrate having a trench formed therein;

FIG. 4 is a cross-sectional view of a semiconductor substrate having a patterned photo-resist layer overlying the active areas of the substrate;

FIG. 5 is a cross-sectional view of a semiconductor substrate with a mask layer having a plurality of protrusions formed therein;

FIG. 6 is a cross-sectional view of a semiconductor substrate having a dielectric layer deposited thereon;

FIG. 7 is a cross-sectional view of a semiconductor substrate after planarization of the dielectric layer has occurred; and FIG. 8 is a cross-sectional view of a semiconductor substrate after removal of the remaining portions of the mask layer and pad oxide layer.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The present invention provides a method of manufacturing a semiconductor device using shallow trench isolation. As shown in FIG. 1, a semiconductor device 10 is provided. The device 10 comprises a semiconductor substrate 12, such as a silicon substrate. A pad oxide layer 14 having a thickness of about 50 to about 300 Å is formed on the substrate 12. The pad oxide layer 14 is present to reduce stress between the substrate 12 and the mask layer 16 described below. The pad oxide layer 14 preferably comprises silicon dioxide. The pad oxide layer 14 may be formed using any conventional deposition or oxidation method known in the art. In a preferred embodiment, the pad oxide layer 14 is formed by chemical vapor deposition or thermal oxidation.

The method of the present invention further comprises forming a mask layer 16 on the exposed surface of the pad oxide layer 14. Preferably, the mask layer 16 comprises silicon nitride and is present at a thickness of about 1,000 to about 4,000 Å. The mask layer 16 serves as an active area mask for forming a shallow trench, as well as a stop layer for the subsequent planarization process. The mask layer 16 may be formed using any conventional deposition method known in the art. Preferably, the mask layer 16 is deposited by low pressure chemical vapor deposition (LPCVD).

As illustrated in FIG. 2, the method of the present invention further comprises defining an active area 26 and an isolation or trench area 24 on the exposed surface of the device 10. Preferably, the active area 26 and isolation area 24 are defined using photolithography techniques known in the art.

For example, the active area 26 and the isolation area 24 may be defined by forming a photo-resist layer 20 on the exposed surface of the mask layer and patterning the photo-resist layer such that the photo-resist layer defines both an active area and a trench area, as shown in FIG. 2. The photo-resist layer 20 may be patterned by applying a photomask to the exposed surface of the photo-resist layer, wherein the photomask contains a pattern that defines an active area 26 and an isolation area 24. The term applying is intended to encompass both contact printing and proximity printing methods. A portion of the photo-resist layer 20 is then exposed to ultraviolet light and removed in order to transfer the pattern of the photomask to the photo-resist layer.

Thereafter, as illustrated in FIG. 3, a trench may be formed in the isolation area 24, the trench extending through the mask layer 16 and pad oxide layer 14 and into the substrate 12. The trench may be formed using any conventional technique known in the art. Preferably, the trench is formed using a dry or wet etching technique. In one embodiment, the trench is formed by RF plasma etching.

Advantageously, after formation of the trench in the isolation area 24, an oxide layer 22 is formed on the surface of the trench, as shown in FIG. 3. The oxide layer 22 preferably comprises thermally grown oxide. The oxide layer 22 may be formed using any thermal oxidation technique known in the art. Alternatively, the oxide layer 22 may be deposited by LPCVD.

The method of the present invention further comprises forming a plurality of protrusions 32 in the exposed surface of the mask layer 16 overlying the defined active area 26, as illustrated in FIG. 5. The protrusions 32 are preferably formed using photolithography and etching techniques known in the art.

For example, as shown in FIG. 4, a second photo-resist layer 30 is formed on the exposed surface of the mask layer 16 and the trench area 24. The photo-resist layer 30 is patterned such that the photo-resist layer defines a plurality of protrusion areas 32 and a depression area 34 within the active area 26 of the device 10 (see FIG. 5). The photo-resist layer 30 may be patterned in the same manner described above for the first photo-resist layer 20. In one embodiment, a photomask is applied to the exposed surface of the photo-resist layer 30, the photomask containing a pattern that defines a plurality of protrusion areas 32 and a depression area 34 within the active area 26. Thereafter, the portion of the photo-resist layer 30 in the defined depression area is exposed to ultraviolet light and removed, thereby transferring the pattern of the photomask to the photo-resist layer, as illustrated in FIG. 4.

A portion of the mask layer 16 in the defined depression area 34 is removed to form a plurality of protrusions 32 in the mask layer. A portion of the mask layer 16 may be removed using any conventional technique known in the art. Preferably, a portion of the mask layer 16 is removed using a wet or dry etching method. In one embodiment, a portion of the mask layer 16 is removed by RF plasma etching. Once the protrusions 32 are formed, the remaining portion of the photo-resist layer 30 is removed, resulting in the structure shown in FIG. 5.

Referring now to FIG. 6, after the protrusions 32 are formed in the mask layer 16, a field oxide or dielectric layer 36 may be deposited on the exposed surface of the mask layer and in the trench. Preferably, the dielectric layer 36 comprises high-density plasma oxide. The dielectric layer 36 may be deposited using any technique known in the art, such as chemical vapor deposition (CVD), low pressure chemical vapor deposition (LPCVD) and plasma-enhanced chemical vapor deposition (PECVD). Preferably, the dielectric layer 36 is deposited using a PECVD technique.

The presence of the protrusions 32 in the mask layer 16 cause the dielectric layer 36 to form peaks or bumps 38 over the protrusions as the dielectric layer is deposited. However, since the peaks 38 are relatively few in number and small in size, they do not adversely affect the planarization process. Instead, the peaks 38 are readily removed using planarization techniques known in the art, such as chemical-mechanical polishing. Further, the photomask used to define the protrusions 32 and depression area 34 in the mask layer 16 is relatively inexpensive to produce, as compared to a conventional photomask that must define numerous dummy active areas within the isolation area 24. Thus, using the method of the present invention, the dielectric layer 36 may be evenly planarized or polished.

As shown in FIG. 7, the peaks 38 are readily removed using a planarization technique, such as CMP. The remaining portion of the mask layer 16 serves as a stop layer for the planarization process. After planarization, the remaining portions of the mask layer 16 and pad oxide layer 14 may be removed using any conventional method known in the art. For example, a wet-etching technique may be used. After removal of these layers, an isolation region 40 is formed in the device 10, thereby providing lateral isolation of the active areas 26 defined in the substrate 12, as shown in FIG. 8.

Thereafter, individual semiconductor devices, such as transistors, may be introduced into the active areas 26 of the device 10.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of manufacturing a semiconductor device using shallow trench isolation, comprising:
    forming a pad oxide layer on a semiconductor substrate;
    forming a mask layer on the exposed surface of the pad oxide layer;
    defining an active area and an isolation area on the substrate;
    forming a trench in the defined isolation area, the trench extending through the mask layer and pad oxide layer and into the substrate;
    forming a plurality of protrusions in the exposed surface of the mask layer overlying the defined active area;
    depositing a dielectric layer on the exposed surface of the mask layer and in the trench; and
    planarizing the dielectric layer.

2. A method according to claim 1, wherein said step of forming a plurality of protrusions comprises:
    forming a photo-resist layer on the exposed surface of the mask layer and in the trench;
    patterning the photo-resist layer such that the photo-resist layer defines a plurality of protrusion areas and a depression area within the defined active area;
    removing a portion of the mask layer in the defined depression area to form a plurality of protrusions in the mask layer; and
    removing the photo-resist layer.

3. A method according to claim 2, wherein said step of patterning the photo-resist layer comprises:
    applying a photomask to the exposed surface of the photo-resist layer, the photomask patterned to define a plurality of protrusion areas and a depression area within the defined active area; and
    removing the photo-resist layer in the defined depression area.

4. A method according to claim 2, wherein said step of removing a portion of the mask layer comprises dry etching a portion of the mask layer.

5. A method according to claim 1, wherein said step of defining an active area and a trench area comprises:
    forming a photo-resist layer on the exposed surface of the mask layer; and
    patterning the photo-resist layer such that the photo-resist layer defines an active area and an isolation area.

6. A method according to claim 5, wherein said step of patterning the photo-resist layer comprises:
    applying a photomask to the exposed surface of the photo-resist layer, the photomask patterned to define an active area and an isolation area in the photo-resist layer; and
    removing the photo-resist layer in the defined isolation area.

7. A method according to claim 1, wherein said step of forming a trench comprises dry etching through the mask layer and the pad oxide layer and into the substrate in the defined isolation area.

8. A method according to claim 1, wherein the pad oxide layer comprises silicon dioxide.

9. A method according to claim 1, wherein said step of forming a pad oxide layer comprises forming a pad oxide layer by chemical vapor deposition or thermal oxidation.

10. A method according to claim 1, wherein the mask layer comprises silicon nitride.

11. A method according to claim 1, wherein said step of forming a mask layer comprises depositing a mask layer by low pressure chemical vapor deposition.

12. A method according to claim 1, wherein the semiconductor substrate is a silicon substrate.

13. A method according to claim 1, wherein said dielectric layer comprises high-density plasma oxide.

14. A method according to claim 1, wherein said step of planarizing the dielectric layer comprises chemical-mechanical polishing the dielectric layer.

15. A method according to claim 1, further comprising removing the mask layer and the pad oxide layer to expose the active area defined in the substrate.

16. A method according to claim 15, further comprising introducing a semiconductor device into the active area defined in the substrate.

17. A method according to claim 16, wherein said device is a transistor.

18. A method according to claim 1, forming an oxide layer on the surface of the trench.

19. A method of manufacturing a semiconductor device using shallow trench isolation, comprising:
    forming a pad oxide layer on a silicon substrate;
    forming a silicon nitride layer on the exposed surface of the pad oxide layer;
    defining an active area and an isolation area on the substrate;

forming a trench in the defined isolation area, the trench extending through the mask layer and pad oxide layer and into the substrate;

forming a photo-resist layer on the exposed surface of the mask layer and in the trench;

patterning the photo-resist layer such that the photo-resist layer defines a plurality of protrusion areas and a depression area within the defined active area; and removing a portion of the mask layer in the defined depression area to form a plurality of protrusions in the mask layer;

depositing a dielectric layer on the exposed surface of the mask layer and in the trench; and planarizing the dielectric layer by chemical-mechanical polishing.

20. A method according to claim 19, further comprising removing the mask layer and the pad oxide layer to expose the active area defined in the substrate.

21. A method according to claim 19, wherein said step of patterning the photo-resist layer comprises:

applying a photomask to the exposed surface of the photo-resist layer, the photomask patterned to define a plurality of protrusion areas and a depression area within the defined active area; and removing the photo-resist layer in the defined depression area by exposure to ultraviolet light.

22. A method according to claim 19, wherein said step of defining an active area and an isolation area comprises:

forming a photo-resist layer on the exposed surface of the mask layer; and patterning the photo-resist layer such that the photo-resist layer defines an active area and an isolation area.

23. A method according to claim 22, wherein said step of patterning the photo-resist layer comprises:

applying a photomask to the exposed surface of the photo-resist layer, the photomask patterned to define an active area and an isolation area in the photo-resist layer; and removing the photo-resist layer in the defined isolation area.

24. A method of manufacturing a semiconductor device using shallow trench isolation, comprising:

forming a pad oxide layer on a silicon substrate;

forming a silicon nitride layer on the exposed surface of the pad oxide layer;

forming a first photo-resist layer on the exposed surface of the mask layer;

applying a photomask to the exposed surface of the first photo-resist layer, the photomask patterned to define an active area and an isolation area in the photo-resist layer; and removing the first photo-resist layer in the defined isolation area;

etching a trench in the defined trench area, the trench extending through the mask layer and pad oxide layer and into the substrate;

removing the remaining portion of the first photo-resist layer;

forming a second photo-resist layer on the exposed surface of the mask layer and in the trench;

applying a photomask to the exposed surface of the second photo-resist layer, the photomask patterned to define a plurality of protrusion areas and a depression area within the defined active area; and removing the photo-resist in the defined depression area; and etching a portion of the mask layer in the defined depression area to form a plurality of protrusions in the mask layer;

depositing a dielectric layer on the exposed surface of the mask layer and in the trench;

planarizing the dielectric layer by chemical-mechanical polishing; and removing the mask layer and the pad oxide layer to expose the active area defined in the substrate.

25. A method according to claim 24, further comprising introducing a semiconductor device into the active area defined in the substrate.

* * * * *